(12) United States Patent
Luft

(10) Patent No.: US 11,005,438 B2
(45) Date of Patent: May 11, 2021

(54) ACTIVE SATURATION PREVENTION OF PULSE-MODE TRANSIMPEDANCE AMPLIFIERS

(71) Applicant: Apple Inc., Cupertino, CA (US)

(72) Inventor: Ido Luft, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 80 days.

(21) Appl. No.: 16/194,347

(22) Filed: Nov. 18, 2018

(65) Prior Publication Data

US 2020/0007101 A1  Jan. 2, 2020

Related U.S. Application Data

(60) Provisional application No. 62/690,979, filed on Jun. 28, 2018.

(51) Int. Cl.
*H03F 3/30* (2006.01)
*H03F 3/08* (2006.01)
*H03F 3/72* (2006.01)

(52) U.S. Cl.
CPC ............... *H03F 3/72* (2013.01); *H03F 3/082* (2013.01); *H03F 3/087* (2013.01); *H03F 3/3084* (2013.01)

(58) Field of Classification Search
USPC ......................................... 330/110, 149, 308
See application file for complete search history.

(56) References Cited

U.S. PATENT DOCUMENTS

| 5,023,445 A | 6/1991 | Goll et al. |
| 9,450,626 B2 | 9/2016 | Choksi et al. |
| 10,338,224 B2 * | 7/2019 | Eken .................... H04B 10/693 |
| 2019/0250256 A1 * | 8/2019 | Gunnam ................. G01S 17/10 |

* cited by examiner

*Primary Examiner* — Hieu P Nguyen
(74) *Attorney, Agent, or Firm* — Kligler & Associates Patent Attorneys Ltd

(57) ABSTRACT

An apparatus includes a Transimpedance Amplifier (TIA), an input interface and input masking circuitry. The TIA is configured to convert input current pulses into output voltage pulses. The input interface is configured to receive a control signal indicative of one or more time intervals. The input masking circuitry is configured to prevent the input current pulses from saturating the TIA during the one or more time intervals indicated by the control signal.

12 Claims, 1 Drawing Sheet

ACTIVE SATURATION PREVENTION OF PULSE-MODE TRANSIMPEDANCE AMPLIFIERS

CROSS-REFERENCE TO RELATED APPLICATIONS

This application claims the benefit of U.S. Provisional Patent Application 62/690,979, filed Jun. 28, 2018, whose disclosure is incorporated herein by reference.

TECHNICAL FIELD

Embodiments described herein relate generally to Transimpedance Amplifiers (TIAs), and particularly to methods and systems for preventing TIA saturation.

BACKGROUND

Transimpedance Amplifiers are used in various types of optical systems, e.g., for amplifying the output of optical detectors. Optical Time-Of-Flight (TOF) systems, for example, sometimes use pulse-mode TIAs.

SUMMARY

An embodiment that is described herein provides an apparatus including a Transimpedance Amplifier (TIA), an input interface and input masking circuitry. The TIA is configured to convert input current pulses into output voltage pulses. The input interface is configured to receive a control signal indicative of one or more time intervals. The input masking circuitry is configured to prevent the input current pulses from saturating the TIA during the one or more time intervals indicated by the control signal.

In some embodiments, the input interface includes a Low-Voltage Differential Signaling (LVDS) interface. In example embodiments, the input interface includes one of (i) a differential interface, (ii) a single-ended interface and (iii) a discrete Input/Output (I/O) line.

In a disclosed embodiment, the input masking circuitry is configured to prevent the input current pulses from saturating the TIA, by performing one or more of attenuating the input current pulses before entering the TIA, diverting the input current pulses away from an input of the TIA, decreasing a gain of the TIA by modifying a feedback loop of the TIA, modifying a biasing of the TIA, and modifying a supply voltage of the TIA.

In an embodiment, the input masking circuitry is configured to prevent the input current pulses from saturating the TIA by controlling two or more cascaded amplification stages of the TIA. In some embodiments, the input masking circuitry is configured to resume normal operation of the TIA immediately following each of the time intervals.

There is additionally provided, in accordance with an embodiment that is described herein, a method including converting input current pulses into output voltage pulses using a Transimpedance Amplifier (TIA). A control signal indicative of one or more time intervals is received. The input current pulses are prevented from saturating the TIA during the one or more time intervals indicated by the control signal.

These and other embodiments will be more fully understood from the following detailed description of the embodiments thereof, taken together with the drawings in which:

DETAILED DESCRIPTION OF EMBODIMENTS

Overview

Embodiments of the present invention that are described herein provide methods and apparatus for preventing TIA saturation. In some disclosed embodiments, a TIA module comprises a TIA, an input interface and input masking circuitry. The TIA is configured to convert input current pulses into output voltage pulses. The input interface is configured to receive a control signal indicative of one or more time intervals. The input masking circuitry is configured to prevent the input current pulses from saturating the TIA during the one or more time intervals indicated by the control signal.

In an example use-case, the disclosed TIA module is used in a receiver of an optical Time-Of-Flight (TOF) system that transmits optical pulses toward a target, receives optical pulses reflected from the target, and estimates the TOF of the pulses. In such a system, the masking operation prevents the TIA from saturating due to the transmitted optical pulses. In a typical embodiment, the response time of the masking operation, as well as resumption of normal operation following each time interval, are on the order of 1 nS or less.

In alternative embodiments, the disclosed TIA module and associated methods can be used in any other suitable system or application.

System Description

Figure 1:
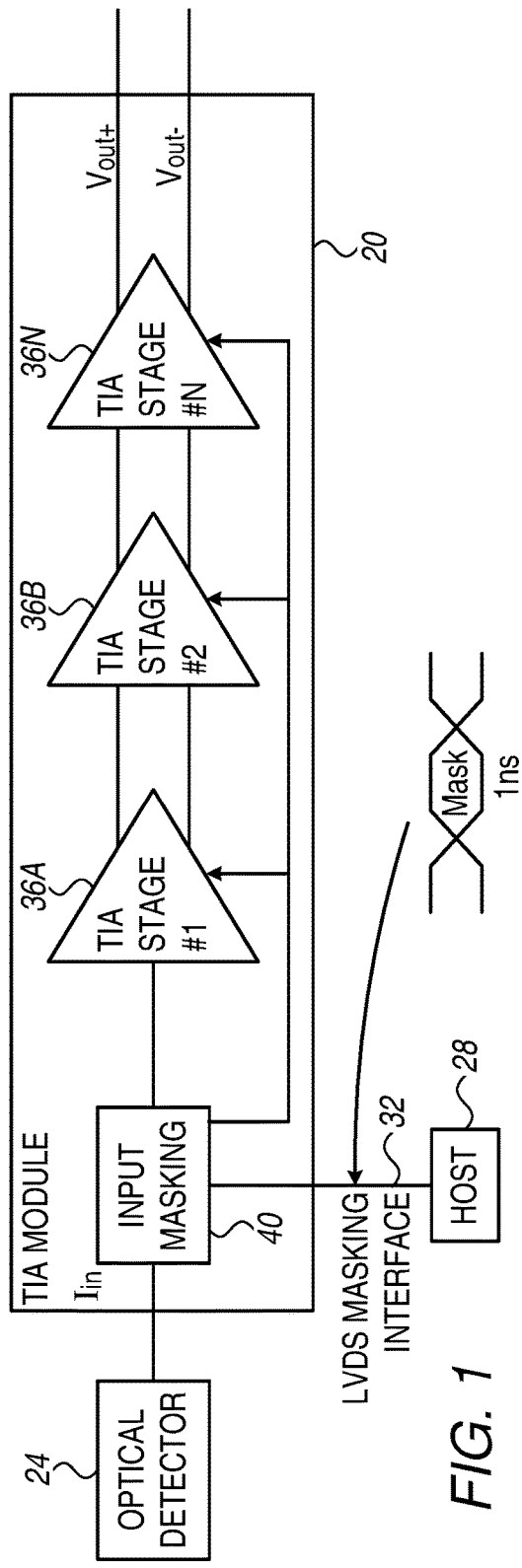
FIG. 1 is a block diagram that schematically illustrates a TIA module having active saturation prevention, in accordance with an embodiment that is described herein.

FIG. 1 is a block diagram that schematically illustrates a TIA module 20 having active saturation prevention, in accordance with an embodiment that is described herein. In the present example, Module 20 receives an input current signal denoted $I_{IN}$, originating from an optical detector 24.

The input signal comprises one or more current pulses to be amplified and further processed. The output of TIA module 20 is a differential voltage signal denoted $V_{OUT}$ (a pair of signals denoted $V_{OUT+}$ and $V_{OUT-}$). The output signal comprises one or more amplified voltage pulses, corresponding to the input current pulses.

TIA module 20 is controlled by a host 28. In particular, host 28 specifies one or more time intervals during which the input current pulses are known or expected to be exceedingly strong, and should be prevented from causing saturation of the TIA. These time intervals are referred to herein as "masking intervals."

Host 28 indicates the masking intervals to TIA module 20, by sending a control signal over a suitable masking interface 32. In the present example interface 32 comprises a Low-Voltage Differential Signaling (LVDS) interface. Alternatively, however, any other suitable type of interface can be used. For example, a single discrete Input/Output (I/O) line can also be used as a masking interface. Generally, the interface may be differential or single-ended. The time resolution of the interface should be sufficiently fine, e.g., on the order of a single nanosecond or even hundreds of picoseconds or less, in order to specify the timing of the masking intervals.

In the example of FIG. 1, TIA module 20 comprises a TIA that comprises multiple cascaded TIA stages 36A ... 36N. Any suitable number of stages can be used, or even a single stage. TIA module 20 further comprises input masking circuitry 40, which masks the input to TIA stages during the time intervals indicated by the control signal received over interface 32.

In various embodiments, masking circuitry 40 may prevent saturation of TIA stages 36 in various ways. An example, non-limiting list of techniques for preventing saturation comprises the following:

- Attenuating, limiting or clamping the input current pulses before entering the TIA.
- Diverting the input current pulses away from the TIA input to some alternative path.
- Decreasing the gain of the TIA by modifying a feedback loop of the TIA. For example, resistors in the feedback loop can be switched to a low value, which in turn decreases the transimpedance gain of the TIA to a value that does not cause saturation.
- Modifying (e.g., shutting down) the biasing of the TIA.
- Modifying (e.g., shutting down) a supply voltage of the TIA.

In the present context, all of these techniques are referred to as "masking the TIA input." Masking circuitry may carry out any of these techniques, or any combination of techniques, or any other suitable technique, for masking the TIA input. Some of the above technique prevent the input current pulses from reaching the TIA as a whole, or from reaching a certain TIA stage. Other techniques enable the current pulses to propagate through the TIA, but prevent the TIA from being saturated.

As can be appreciated, some of the techniques listed above modify the input current pulses before they enter the TIA stages, whereas other techniques modify the operating point of one or more of the TIA stages. As such, in the figure circuitry 40 is shown inserted in the signal path, and also controls the TIA stages themselves. In alternative embodiments, however, it is possible to use only one of these schemes. Techniques that modify the TIA operating point can be applied to one TIA stage (e.g., the first stage) or to multiple TIA stages.

For any selected masking technique, a prime consideration is fast response, both on activation of the masking and on settling after resumption of normal operation. Both response times are typically on the order of a single nanosecond, or even sub-nanosecond. Any suitable pulse width can be accommodated, e.g., 4 nS, 8 nS, 10 nS, or any other suitable pulse width.

The configuration of TIA module 20 shown in FIG. 1 is an example configuration that is chosen purely for the sake of conceptual clarity. In alternative embodiments, any other suitable configuration can be used. TIA module 20 can be implemented using any suitable hardware, such as in an Application-Specific Integrated Circuit (ASIC) and/or using multiple ICs and/or discrete components.

Figure 2:
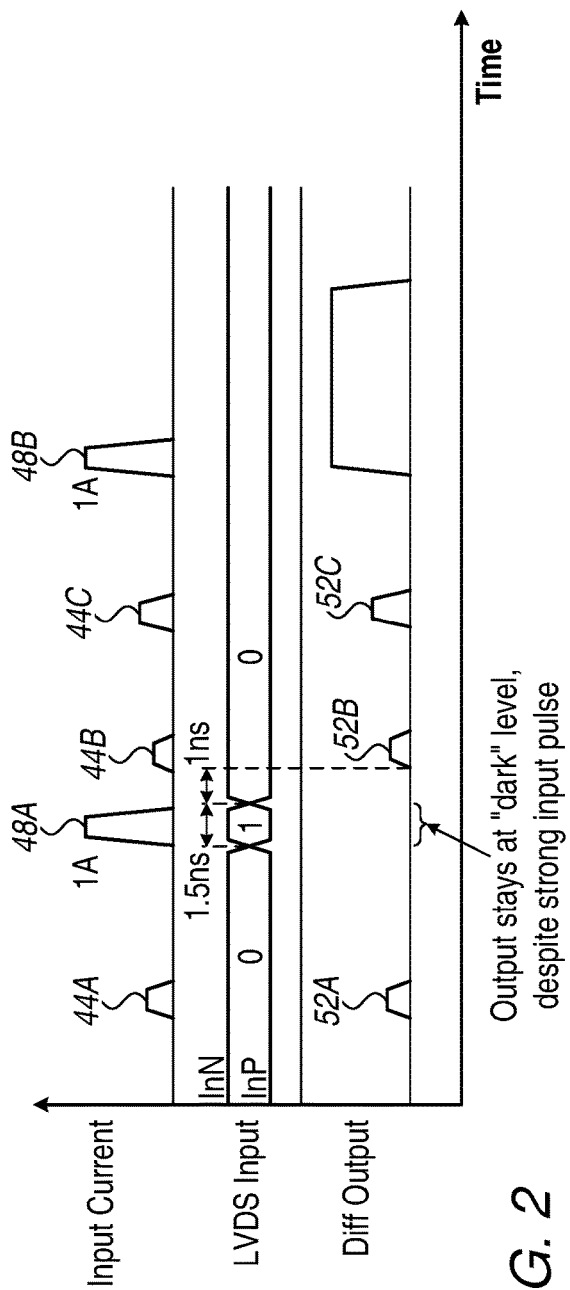
FIG. 2 is a graph showing input, output and control signals in the TIA module of FIG. 1 during active saturation prevention, in accordance with an embodiment that is described herein.

FIG. 2 is a graph showing input, output and control signals in TIA module 20 of FIG. 1 during active saturation prevention, in accordance with an embodiment that is described herein. From top to bottom, FIG. 2 shows the input current $I_{IN}$, the control signal provided over the LVDS interface, and the output signal $V_{OUT}$, as a function of time.

In the example of FIG. 2, the input signal comprises three current pulses (denoted 44A, 44B and 44C) that should be received and amplified by the TIA, and two strong current pulses (denoted 48A and 48B) that should be masked. The timing of pulses 48A and 48B is known to host 28, e.g., because they originate from transmitted optical pulses of the same TOF system.

As can be seen in the figure, input current pulses 44A, 44B and 44C are not masked, and are amplified by the TIA. The resulting output voltage pulses are denoted 52A, 52B and 52C, respectively.

In order to mask pulse 48A, host 28 asserts the control signal to "1" during the 1.5 nS long interval spanned by the pulse. In response, input masking circuitry 40 masks the TIA input. As a result, pulse 48A is not amplified, and no output pulse is seen at the TIA output.

The fast settling time after the end of the masking interval can also be seen in the figure: Pulse 44B begins only 1 nS after the end of the masking interval. Nevertheless, masking circuitry 40 is sufficiently fast to resume normal operation, such that pulse 44B is amplified correctly to produce pulse 52B at the TIA output.

In the present example, input pulse 48B is not masked even though it should be, in order to demonstrate the adverse effect of saturation. As can be seen at the bottom right of the figure, without masking using the disclosed techniques, input pulse 48B causes the TIA to output non-linear distortion for an extended period of time of several nanoseconds after the input pulse has ended.

The signals in FIG. 2 are depicted purely by way of example, in order to demonstrate the disclosed masking techniques. In alternative embodiments, the input, control and output signals may differ. For example, in FIG. 2 an input current pulse of 1 Amp is masked entirely, i.e., the output voltage does not deviate from the baseline "dark" level during the masking interval. In alternative embodiments, the presence of a residual output pulse it permissible, as long as the TIA remains well within its linear range.

The methods and systems described herein are in no way limited to the example applications and host systems described herein. The disclosed techniques can be used in any suitable application, such as in range-finding systems or other Time-Of-Flight (TOF) systems, and/or any other suitable system or application.

It will thus be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
    a Transimpedance Amplifier (TIA), configured to convert input current pulses into output voltage pulses;
    an input interface, configured to receive a control signal indicative of one or more time intervals; and
    input masking circuitry, configured to prevent the input current pulses from saturating the TIA, and from appearing on an output of the TIA, during the one or more time intervals indicated by the control signal.

2. The apparatus according to claim 1, wherein the input interface comprises a Low-Voltage Differential Signaling (LVDS) interface.

3. The apparatus according to claim 1, wherein the input interface comprises one of (i) a differential interface, (ii) a single-ended interface and (iii) a discrete Input/Output (I/O) line.

4. The apparatus according to claim 1, wherein the input masking circuitry is configured to prevent the input current pulses from saturating the TIA, and from appearing on an output of the TIA, by performing one or more of:
- attenuating the input current pulses before entering the TIA;
- diverting the input current pulses away from an input of the TIA;
- decreasing a gain of the TIA by modifying a feedback loop of the TIA;
- modifying a biasing of the TIA; and
- modifying a supply voltage of the TIA.

5. The apparatus according to claim 1, wherein the input masking circuitry is configured to prevent the input current pulses from saturating the TIA, and from appearing on an output of the TIA, by controlling two or more cascaded amplification stages of the TIA.

6. The apparatus according to claim 1, wherein the input masking circuitry is configured to resume normal operation of the TIA immediately following each of the time intervals.

7. A method, comprising:
- converting input current pulses into output voltage pulses using a Transimpedance Amplifier (TIA);
- receiving a control signal indicative of one or more time intervals; and
- preventing the input current pulses from saturating the TIA, and from appearing on an output of the TIA, during the one or more time intervals indicated by the control signal.

8. The method according to claim 7, wherein receiving the control signal comprises receiving the control signal over a Low-Voltage Differential Signaling (LVDS) interface.

9. The method according to claim 7, wherein receiving the control signal comprises receiving the control signal over one of (i) a differential interface, (ii) a single-ended interface and (iii) a discrete Input/Output (I/O) line.

10. The method according to claim 7, wherein preventing the input current pulses from saturating the TIA, and from appearing on an output of the TIA, comprises performing one or more of:
- attenuating the input current pulses before entering the TIA;
- diverting the input current pulses away from an input of the TIA;
- decreasing a gain of the TIA by modifying a feedback loop of the TIA;
- modifying a biasing of the TIA; and
- modifying a supply voltage of the TIA.

11. The method according to claim 7, wherein preventing the input current pulses from saturating the TIA, and from appearing on an output of the TIA, comprises controlling two or more cascaded amplification stages of the TIA.

12. The method according to claim 7, and comprising resuming normal operation of the TIA immediately following each of the time intervals.

* * * * *